United States Patent
Biglieri et al.

(10) Patent No.: US 6,278,274 B1
(45) Date of Patent: Aug. 21, 2001

(54) NUCLEAR MAGNETIC RESONANCE IMAGING APPARATUS HAVING A MAGNETIC STRUCTURE THAT OSCILLATES ABOUT AN AXIS

(75) Inventors: Eugenio Biglieri, Masio; Osvaldo Pugliese, Genova; Fabio Rezzonico, Como; Luigi Satragno, Genova, all of (IT)

(73) Assignee: Esaote S.p.A., Casale Monferrato (IT)

( * ) Notice: Subject to any disclaimer, the term of this patent is extended or adjusted under 35 U.S.C. 154(b) by 0 days.

(21) Appl. No.: 09/372,609

(22) Filed: Aug. 12, 1999

(30) Foreign Application Priority Data

Aug. 31, 1998 (IT) .............................................. SV98A0049

(51) Int. Cl.$^7$ ...................................................... G01V 3/00
(52) U.S. Cl. .............................................................. 324/318
(58) Field of Search .................................. 324/318, 319, 324/309, 307, 320

(56) References Cited

U.S. PATENT DOCUMENTS

| | | | |
|---|---|---|---|
| 4,985,678 | 1/1991 | Gangarosa et al. | 324/318 |
| 5,008,624 | 4/1991 | Yoshida | 324/318 |
| 5,153,546 | 10/1992 | Laskaris | 324/318 |
| 5,592,090 | 1/1997 | Pissanetzky | 324/319 |

FOREIGN PATENT DOCUMENTS

| | | |
|---|---|---|
| 0 654 675 A1 | 5/1995 | (EP) . |
| 63-286142 | 11/1988 | (JP) . |

Primary Examiner—Christine Oda
Assistant Examiner—Dixomara Vargas
(74) Attorney, Agent, or Firm—Burns, Doane, Swecker & Mathis, L.L.P.

(57) ABSTRACT

Nuclear Magnetic Resonance imaging apparatus of the type for imaging specific parts of the body, the device including a magnetic structure (1), having a cavity (101) for accommodating the limb part to be examined, which may be accessed from the outside, and in which, or at least in one part of which (V) the necessary magnetic fields are generated. The magnetic structure (1) is supported in such a manner as to be able to oscillate (O) about a horizontal axis, which is parallel to the static magnetic field, whereas the axis of oscillation (O) is staggered with respect to the central axis, which is parallel thereto and passes through the cavity volume (V), wherein the static magnetic field has the characteristics required for valid imaging, to such an extent that the relevant volume (V) moves from an uppermost position to a lowermost position, the two extreme positions as well as those intervening therebetween being adjusted to the head and/or neck and/or upper limbs level in the standing and/or sitting positions of the patient and to the lower limbs level in the standing and/or sitting positions of the patient respectively.

27 Claims, 16 Drawing Sheets

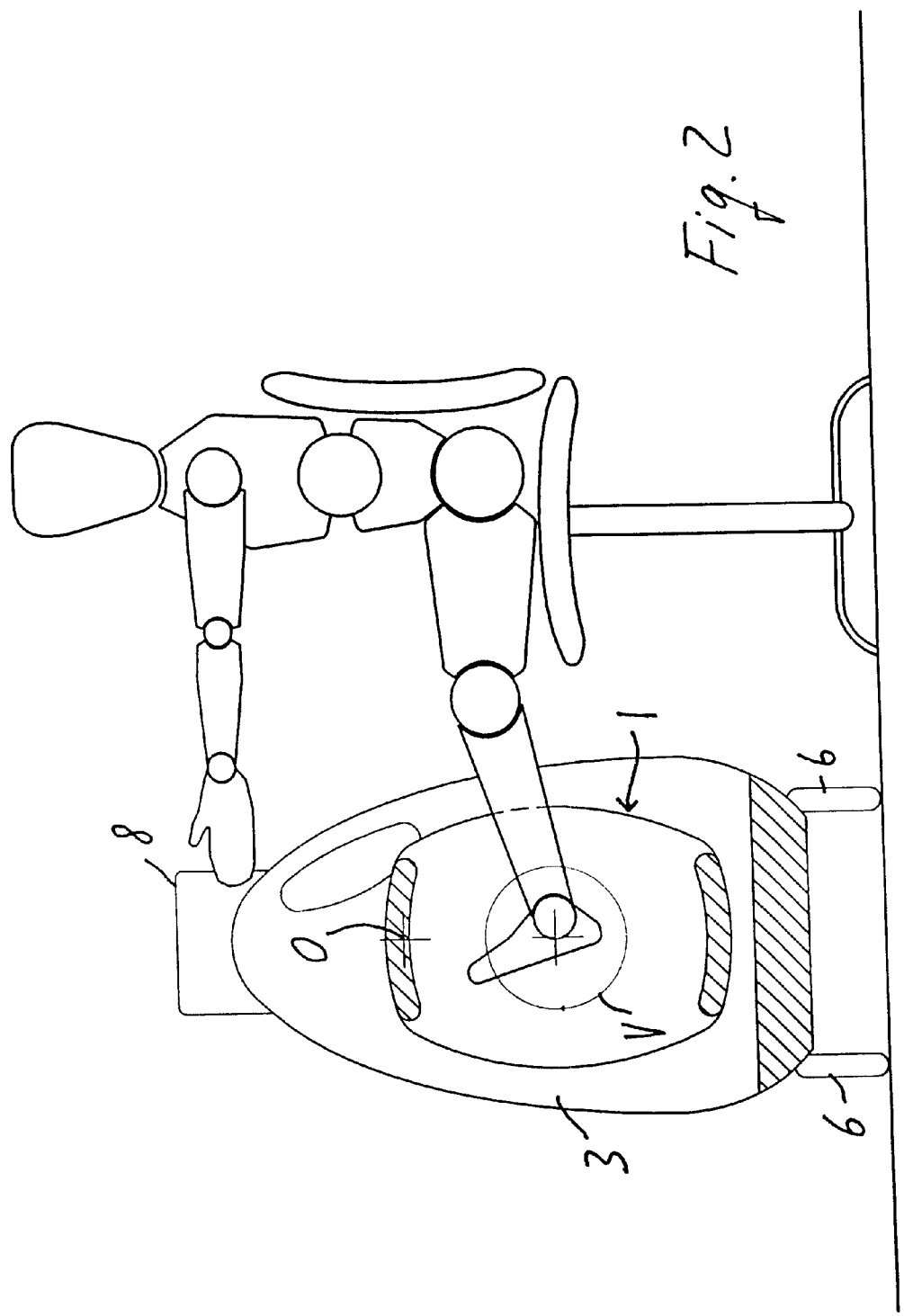

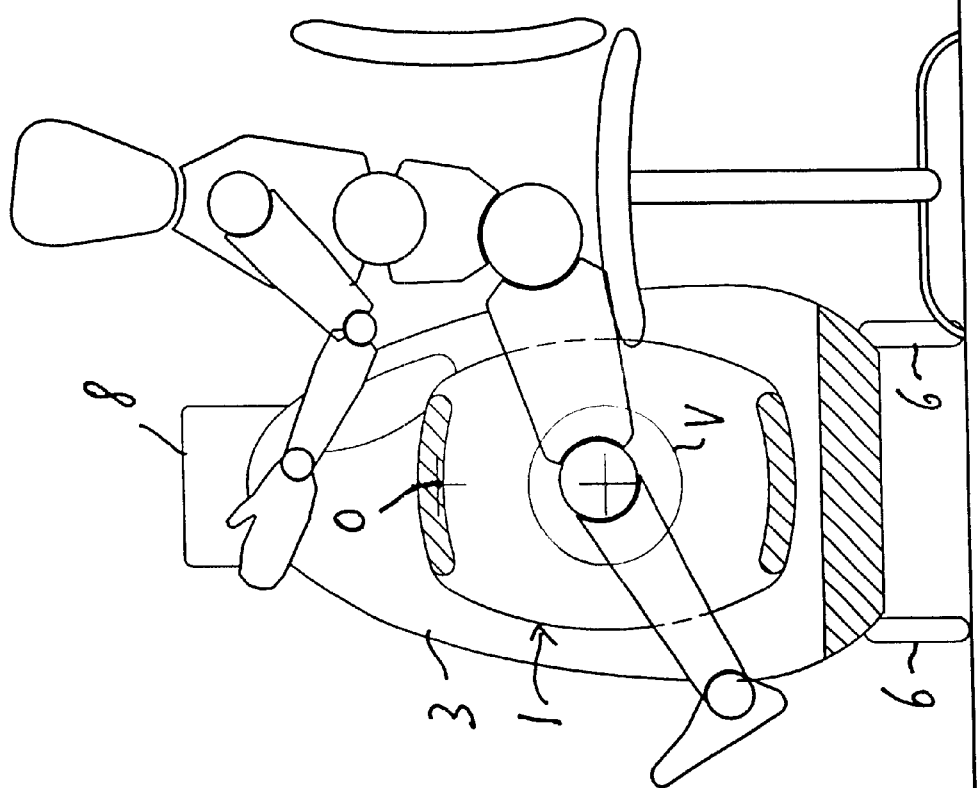

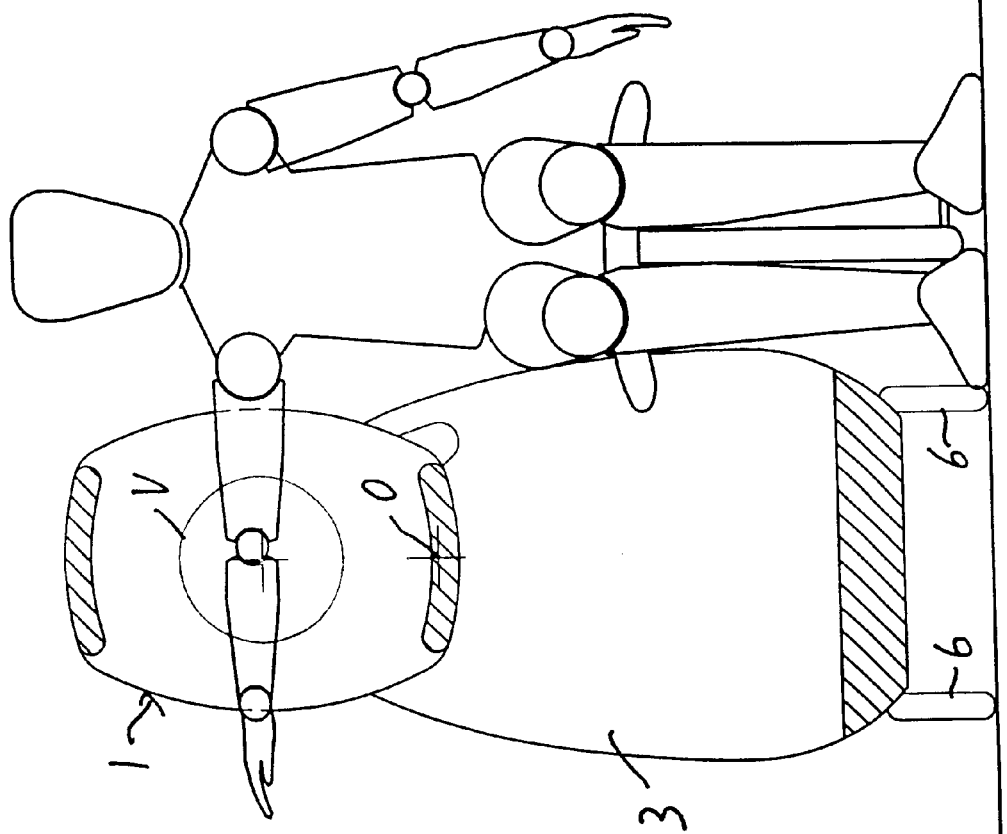

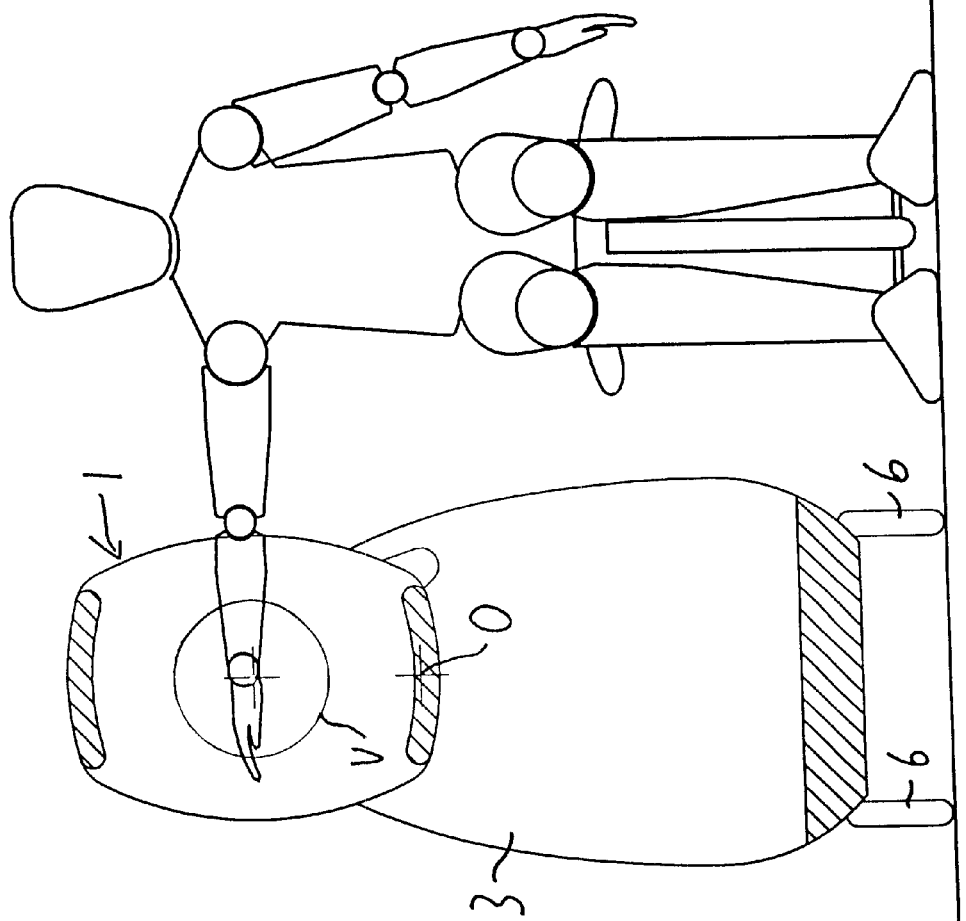

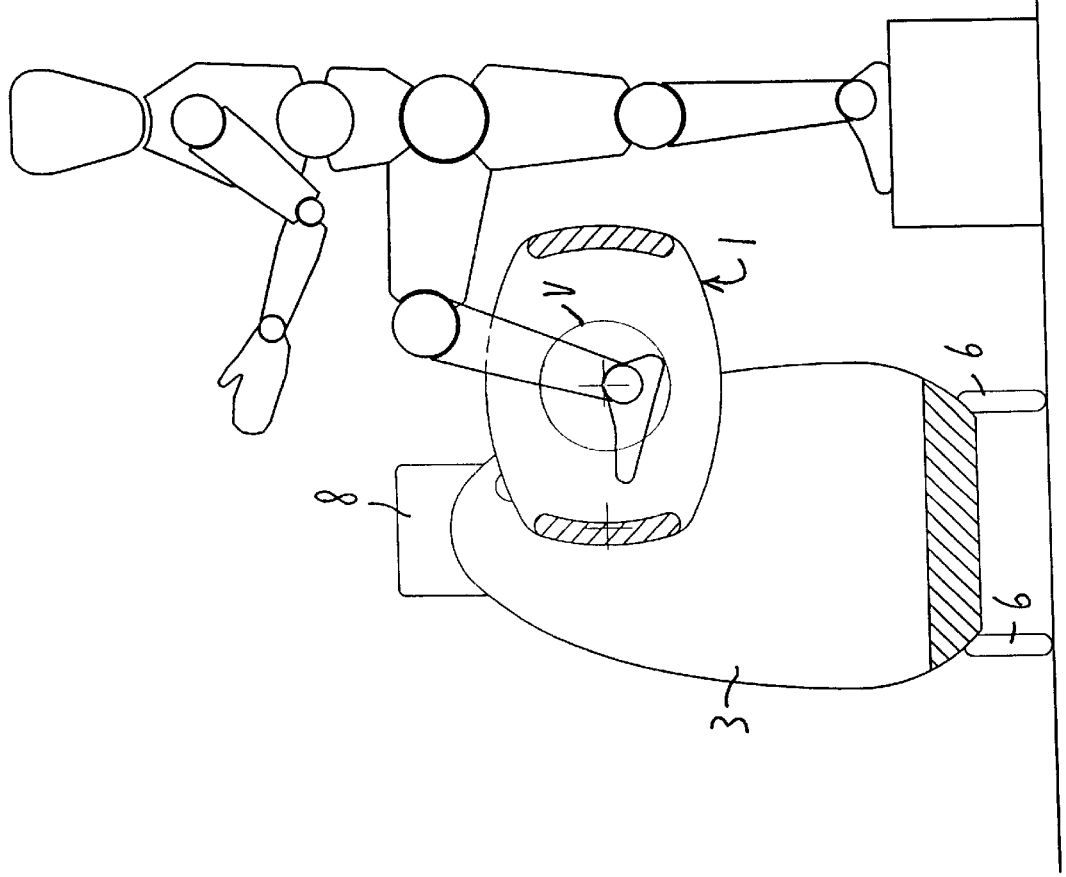

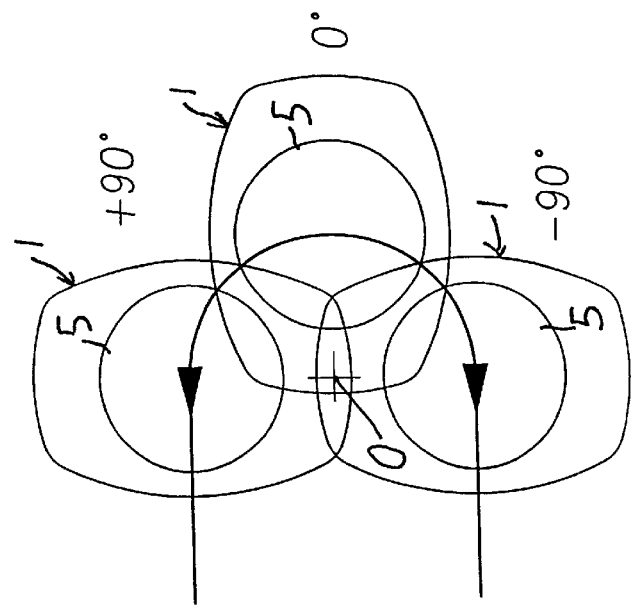
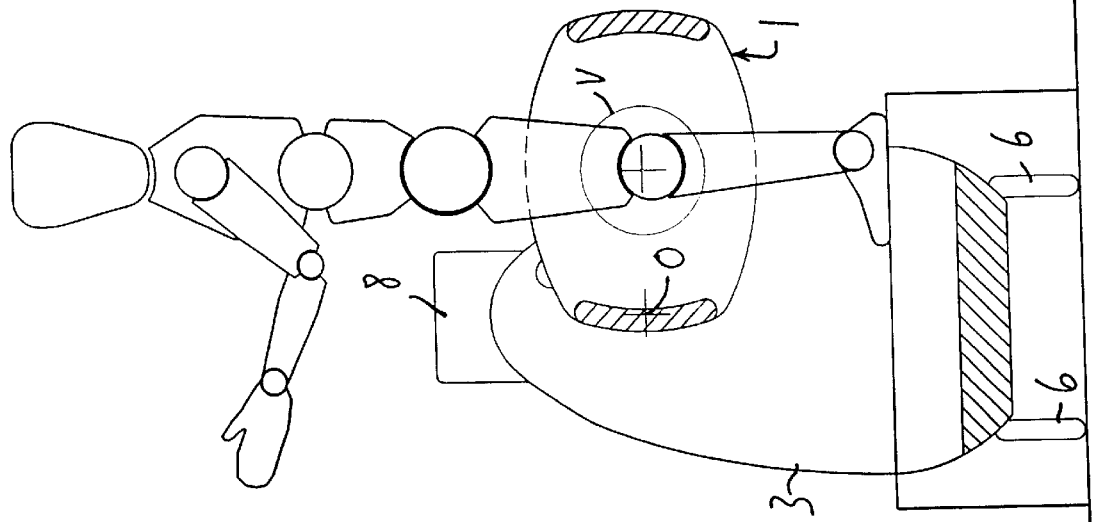
Fig. 8
Fig. 7

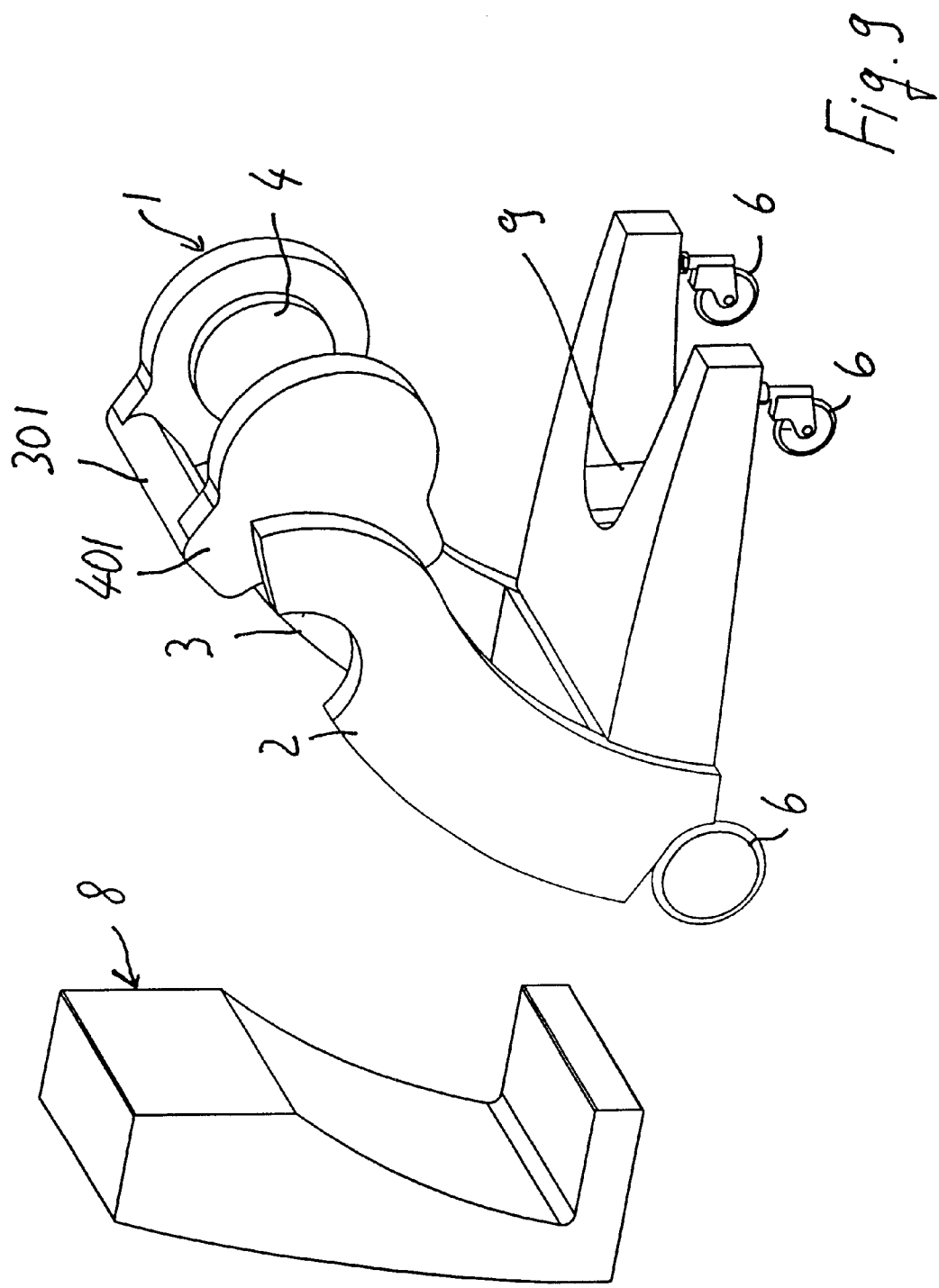

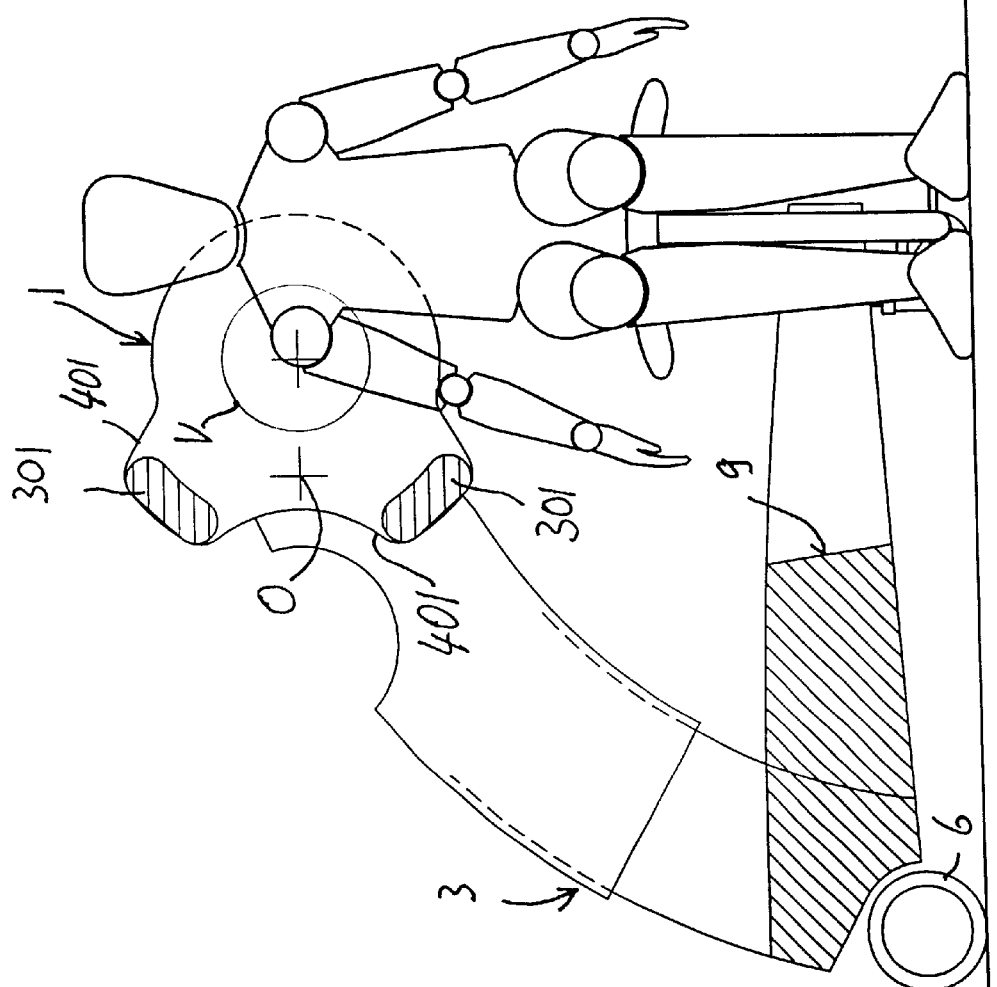

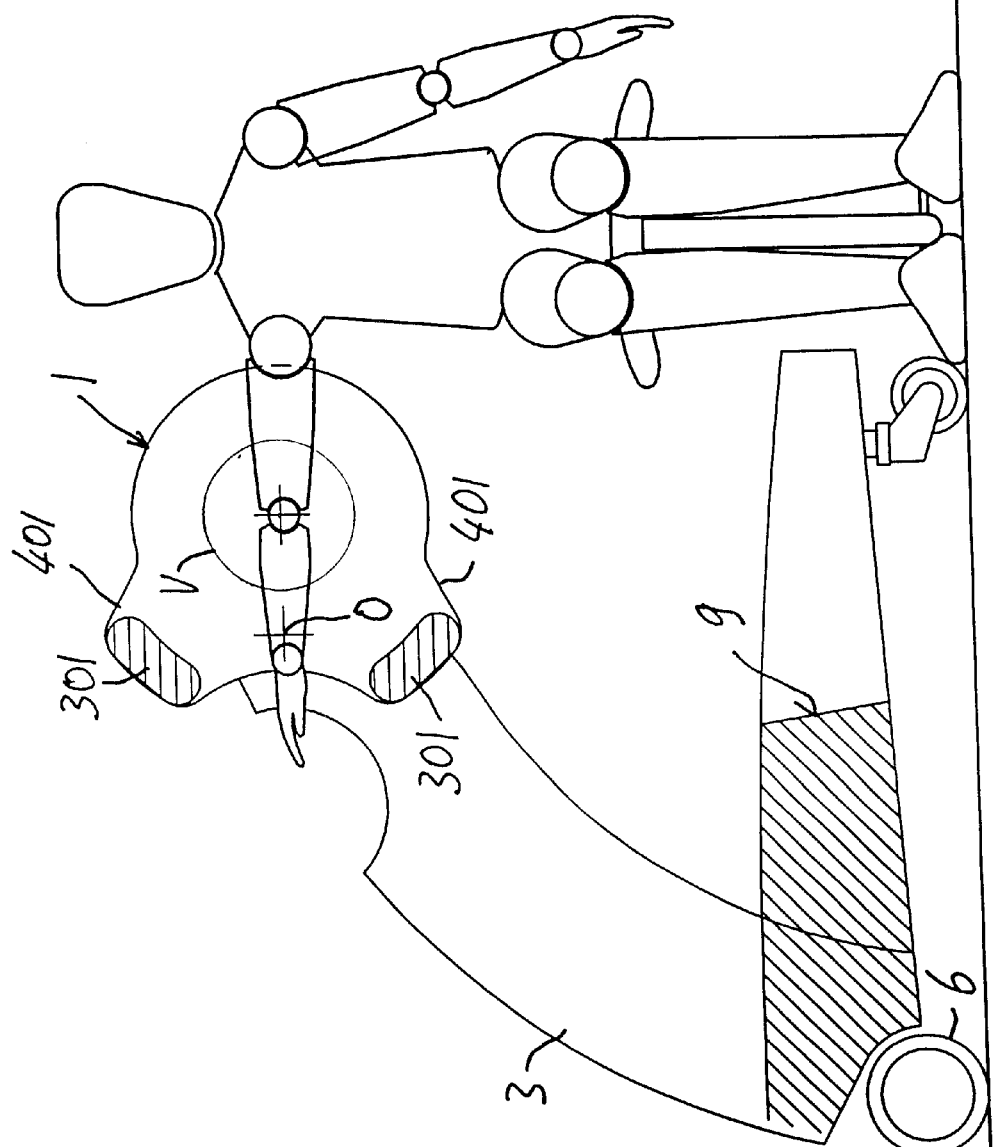

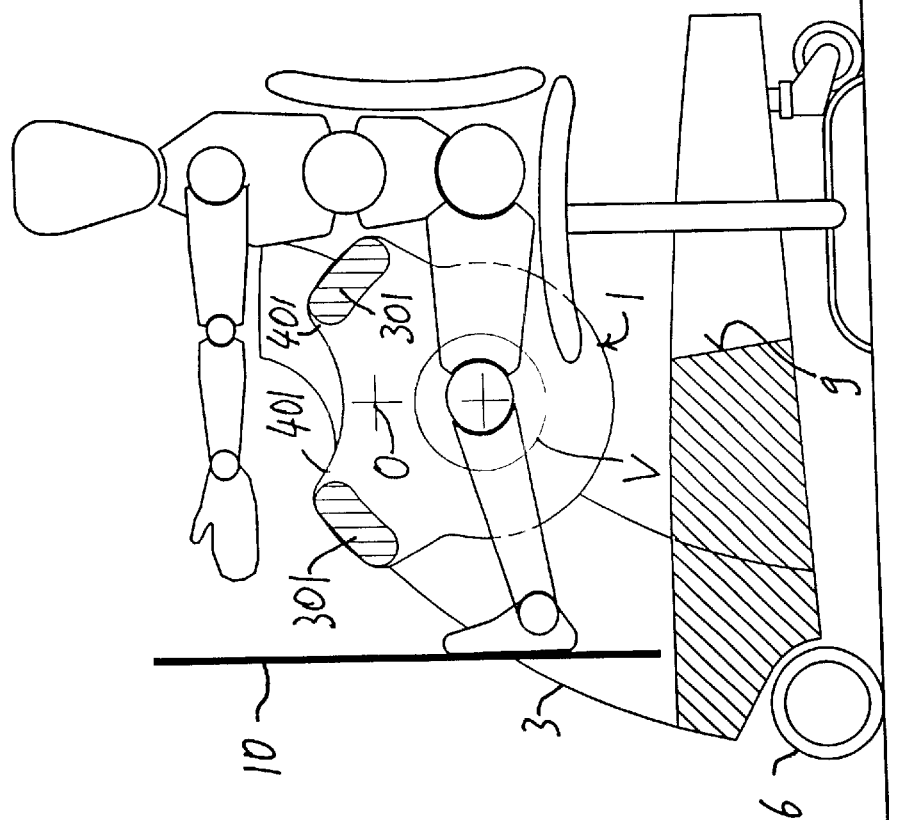

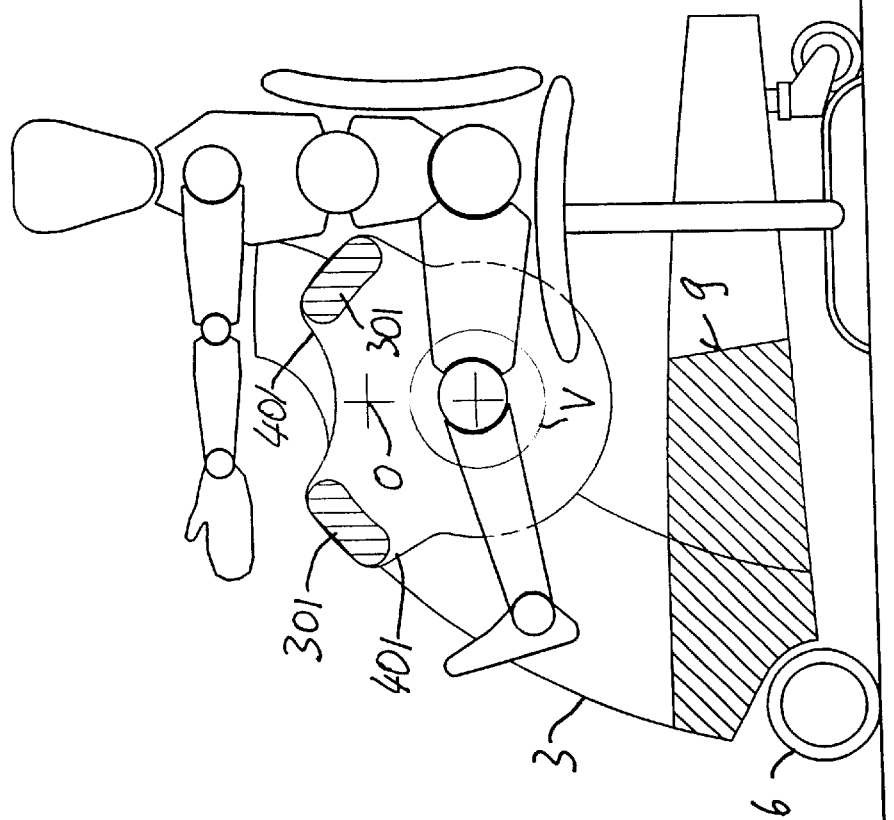

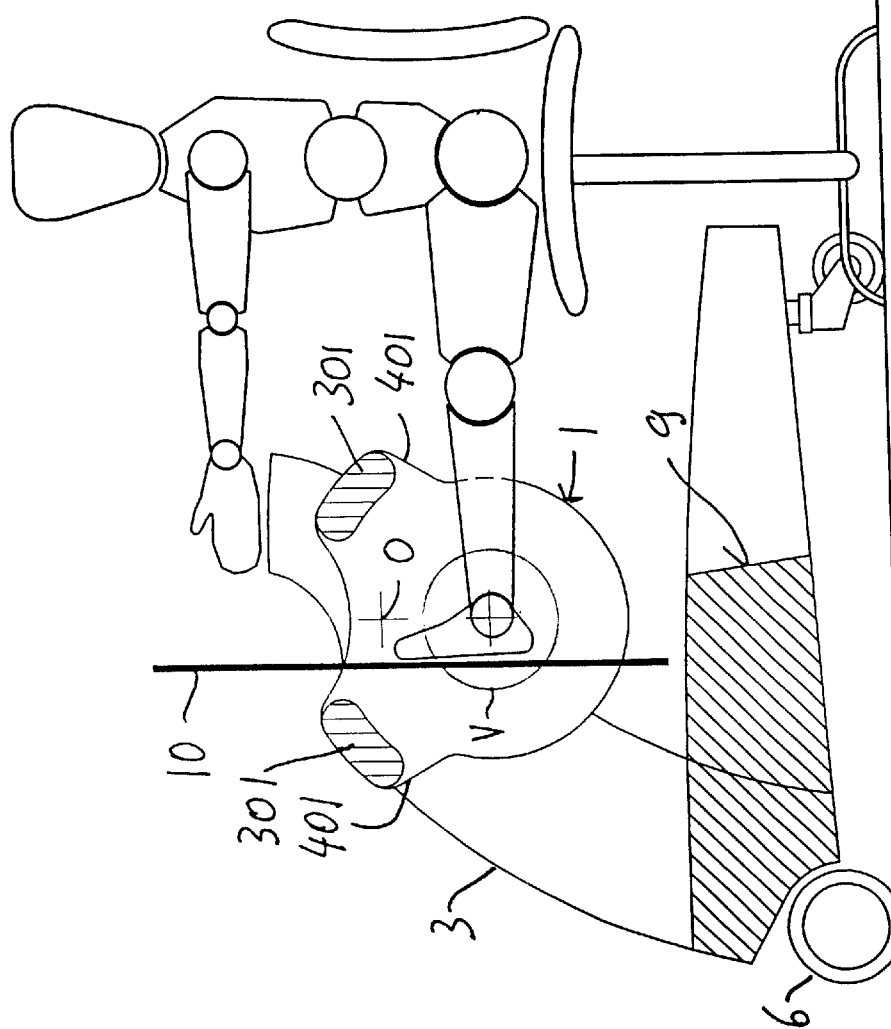

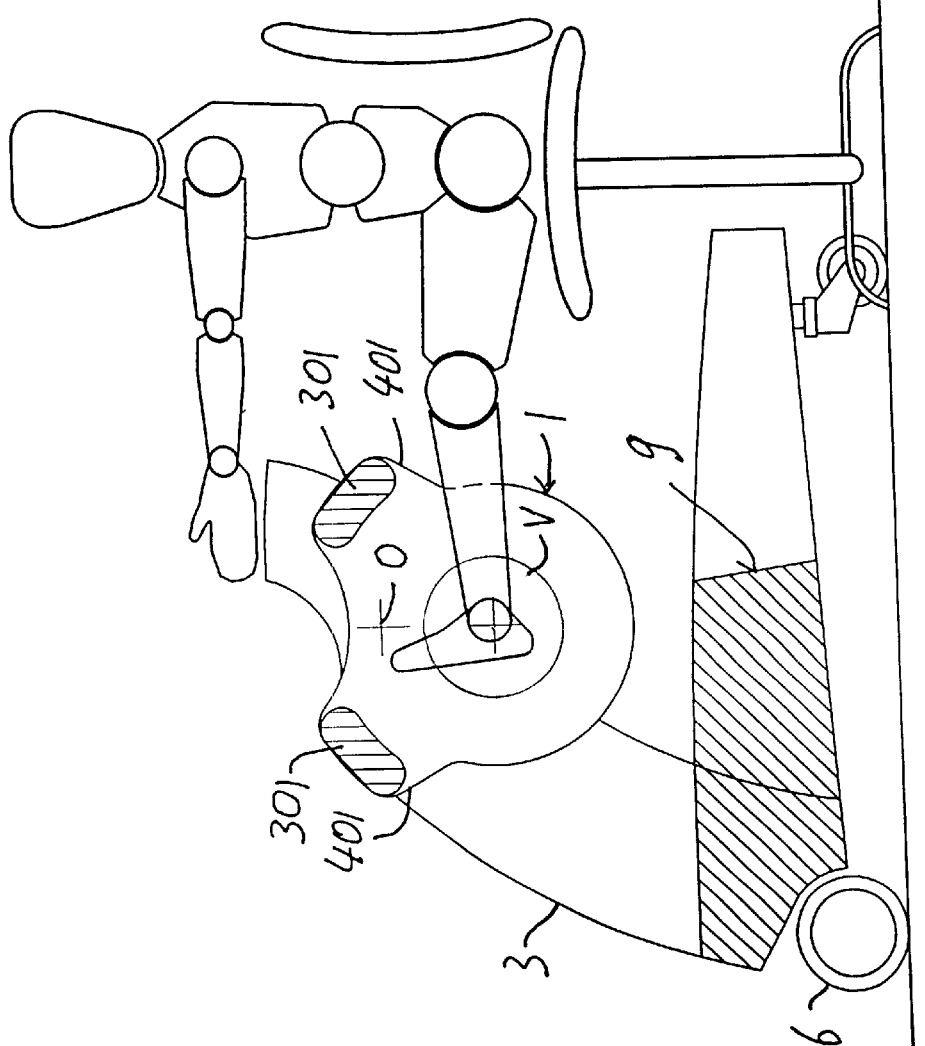

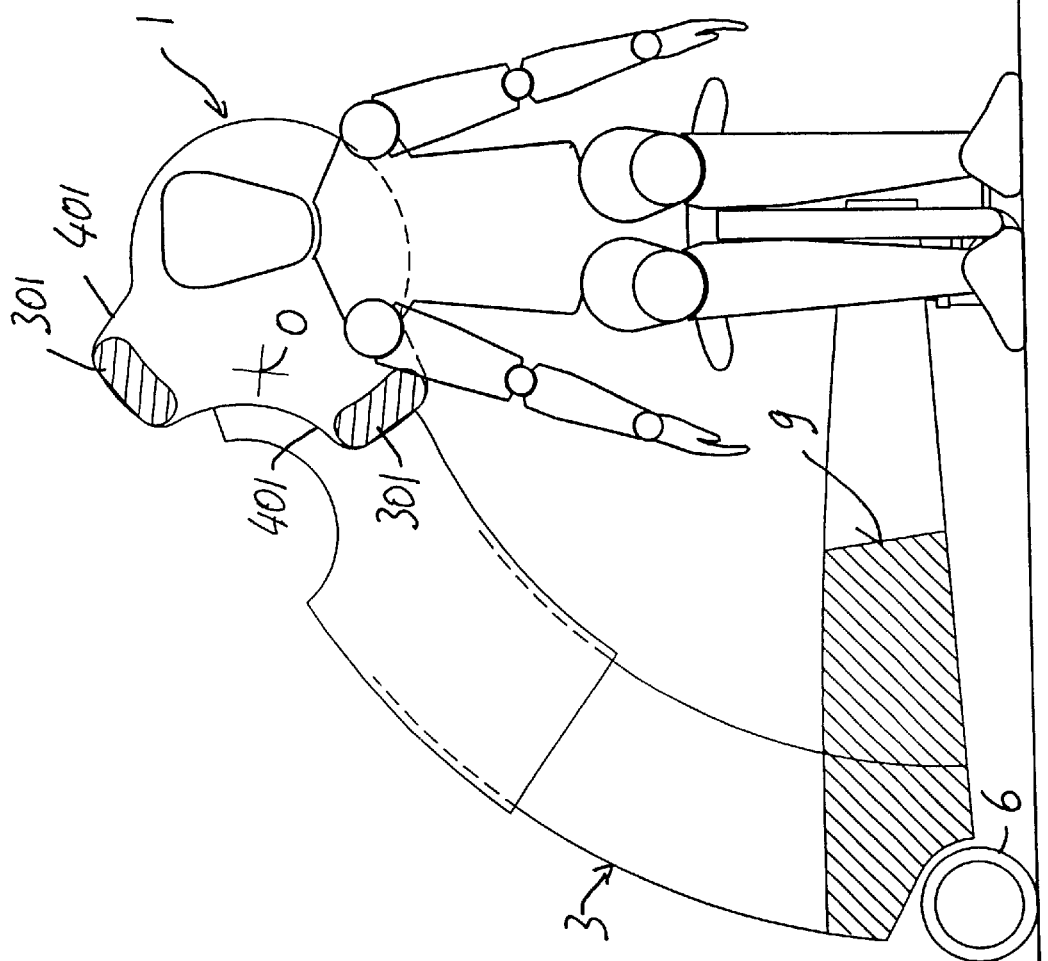

US 6,278,274 B1

NUCLEAR MAGNETIC RESONANCE IMAGING APPARATUS HAVING A MAGNETIC STRUCTURE THAT OSCILLATES ABOUT AN AXIS

BACKGROUND OF THE INVENTION

1. Field of the Invention

The invention relates to a Nuclear Magnetic Resonance imaging apparatus of the type for imaging specific parts of the body, defined in the jargon as "dedicated MRI", comprising a magnetic structure, having a cavity for accommodating the limb part to be examined which may be accessed from the outside, and designed to generate in this cavity or at least in a part thereof, the magnetic and electromagnetic fields required for Nuclear Magnetic Resonance imaging, which structure is mounted on a support, in such a manner as to be movable.

2. Description of Related Art

U.S. Pat. No. 5,008,624 discloses an apparatus comprising means for supporting the patient in several inclined positions with respect to the horizontal plane, combined with a U-shaped magnetic structure which bears, at the free ends of the U stems, two poles for generating the static field required for Nuclear Magnetic Resonance imaging. The U-shaped magnetic structure is supported on a stationary frame so as to be able to rotate about a horizontal axis, coinciding with the median axis of the U-shaped magnetic structure, perpendicular to its stems. The apparatus is designed for imaging the head of the patient, who can take several inclined positions with respect to the horizontal plane, by operating on the supporting means, typically an arm-chair convertible into a table, having a folded back and an inclinable seat.

The disclosed construction is such that, in the various inclined positions of the magnetic structure, any use of the apparatus for imaging other body parts is difficult. The armchair-table is complex and costly and anyway limits the operating opportunities of the apparatus. The latter is designed so as to be able to accommodate large parts of the body, so the magnetic structure is heavy and cumbersome.

OBJECTS AND SUMMARY

An object of the invention is to provide an apparatus, so that, by simple and inexpensive means, the operational flexibility thereof is increased, allowing examination of a great number of anatomic regions, both of the upper and lower limbs, as well as of the head and neck, by using a single magnetic structure and different positions of the patient.

The invention achieves the above purposes by providing an apparatus, wherein the magnetic structure is supported in such a manner as to be able to oscillate about a horizontal axis, parallel to the static magnetic field generated thereby, whereas the axis of rotation is staggered with respect to the central axis, which is parallel thereto and passes through the cavity volume wherein the static magnetic field has the characteristics required for valid diagnostic imaging, to such an extent that the relevant volume moves from an uppermost position to a lowermost position, the two extreme positions and those intervening therebetween being adjusted to the head and/or neck and/or upper limbs level in the standing and/or sitting position of the patient and to the lower limbs level in the standing and/or sitting positions of the patient respectively.

Particular advantages, with respect to human anatomy, are obtained by a configuration in which the axis of rotation of the magnetic structure is eccentric to the median axis of the overall geometry thereof, whereas the magnetic structure has radial dimensions, with respect to the median axis thereof, parallel to the axis of oscillation, of $\frac{1}{10}$ to $\frac{4}{10}$ of the average height of an adult in his/her standing position.

According to a variant embodiment, a configuration may be provided wherein the axis of rotation of the magnetic structure is eccentric to the median axis of the overall geometry thereof, whereas the magnetic structure has radial dimensions, with respect to the median axis thereof, parallel to the axis of oscillation, of $\frac{1}{8}$ to $\frac{4}{8}$ of the average height of an adult in his/her sitting position.

The position of the axis of oscillation of the magnetic structure with respect to the ground is generally higher than the greatest radial dimensions of the magnetic structure with respect to the ground.

The aperture/s for access to the imaging cavity of the magnetic structure are provided in such a position that at least a part thereof has a central axis perpendicular to the axis of rotation, whereas in the two upper and lower positions, they are at least partly turned towards the patient, and in the perpendicular condition of this axis of the apertures, they are substantially turned downwards or upwards.

When the magnet has an annular shape, it is supported in such a manner as to be able to oscillate with an eccentric axis radial to the axis of two apertures for accessing a through cavity. The upper and lower positions are rotationally symmetrical, whereas, in the intermediate position, the axis of the apertures is perpendicular.

The annular shape may be round, oval, non-round, rectangular, square, or polygonal or a combination of these shapes, either symmetrical or asymmetrical to one or more reference axes or points.

Alternatively, a magnetic structure may be used which has two opposite poles, preferably circular and connected together by an axial member perpendicular to the poles and jointed thereto at least at one peripheral point.

When viewed in the direction of the axis of oscillation, the magnet may have any round, oval, non-round, rectangular, square or polygonal shape or a combination of these shapes, either symmetrical or asymmetrical to one or more reference axes or points.

This axial member may have the shape of a column but two or more columns may be also provided, in an appropriate arrangement along the circumference.

Preferably, the two or more columns are grouped in the peripheral area of the two opposite poles in order to provide a wider access aperture.

A further improvement provides that the imaging cavity area in which the magnetic field of the structure has sufficient characteristics to provide valid Nuclear Magnetic Resonance imaging, is substantially located in the median region of the overall radial dimensions of the structure with reference to the median axis thereof, parallel to the axis of oscillation.

A further characteristic of the invention provides that the height of the axis of oscillation of the magnetic structure from the ground is variable. This is possible, for example, by providing a support structure comprising two opposite uprights whereto the respective sides of the magnetic structure are pivoted about the same axis. Here, there may be provided, alternatively or in combination, that the pivot points of the magnetic structure are supported by slidable shoes on said uprights, or that the uprights are extensible or inclinable.

According to an improvement, the magnetic structure is supported upon a wheeled, freely movable cart.

Advantageously, the apparatus of the invention, has, in addition to the movable magnetic structure, also has a console and/or control panel, which may be at least oriented, but even moved away or separated from the structure or anyway disjoined from the apparatus, being provided, in this case, with a connecting wire.

Thanks to the above arrangements a Nuclear Magnetic Resonance imaging apparatus is obtained, which is highly versatile and flexible and may be easily moved or adapted to the conditions or positions of the patient, who may be forced by any possible disease to take a rigid and immobile position with the specific limb under examination.

Particularly, for instance in the upright i.e. standing position and in the sitting position of the patient, the magnetic structure may be moved angularly and/or by a height change of the axis of oscillation thereof at the upper or lower limbs or at the head or neck of the patient. Particularly, for instance, Nuclear Magnetic Resonance imaging may be performed in the region of the lower limbs while the patient is in the upright position, and in a condition wherein the limb, i.e. the leg, the knee, the neck, or similar are loaded or stressed.

By reducing the area of the cavity volume wherein the magnetic field has sufficient characteristics to allow valid imaging, to a minimum volume, required to examine the most relevant regions of the part of the limb under examination, the magnetic structure may be also considerably reduced, as to its size and weight, whereby an easily movable and adaptable machine may be obtained, with no need to provide motor-driven actuators or at least high power and space requiring actuators.

If the region to be examined is larger, the easy use of the machine allows to detect several staggered images of said region for covering it totally.

Further improvements of the invention will form the subject of the dependent claims.

BRIEF DESCRIPTION OF THE DRAWINGS

The characteristics of the invention will be understood more clearly from the following description of certain preferred embodiments, illustrated by way of non limiting example in the accompanying drawings, in which:

FIGS. 2 to 7 show several different operating conditions of the apparatus as shown in FIG. 1.

FIG. 8 shows the two extreme positions, the height of the axis of the apertures being indicated, and an intermediate position in which this axis is vertical.

FIG. 9 shows a second embodiment of the invention, like in FIG. 1.

FIGS. 10 to 17 show, like in FIGS. 2 to 7, several different operating conditions of the apparatus as shown in FIG. 9.

DETAILED DESCRIPTION OF THE PREFERRED EMBODIMENTS

Figure 1:
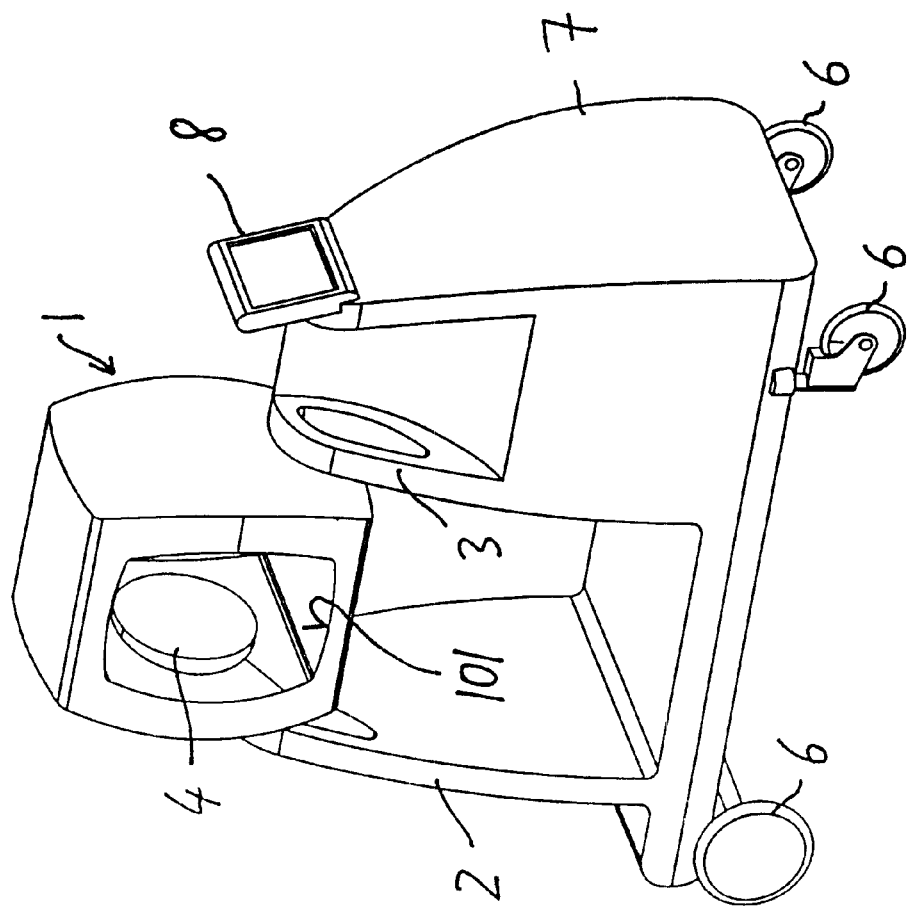
FIG. 1 shows a perspective view of a first embodiment of an apparatus according to the invention.
Figure 11:
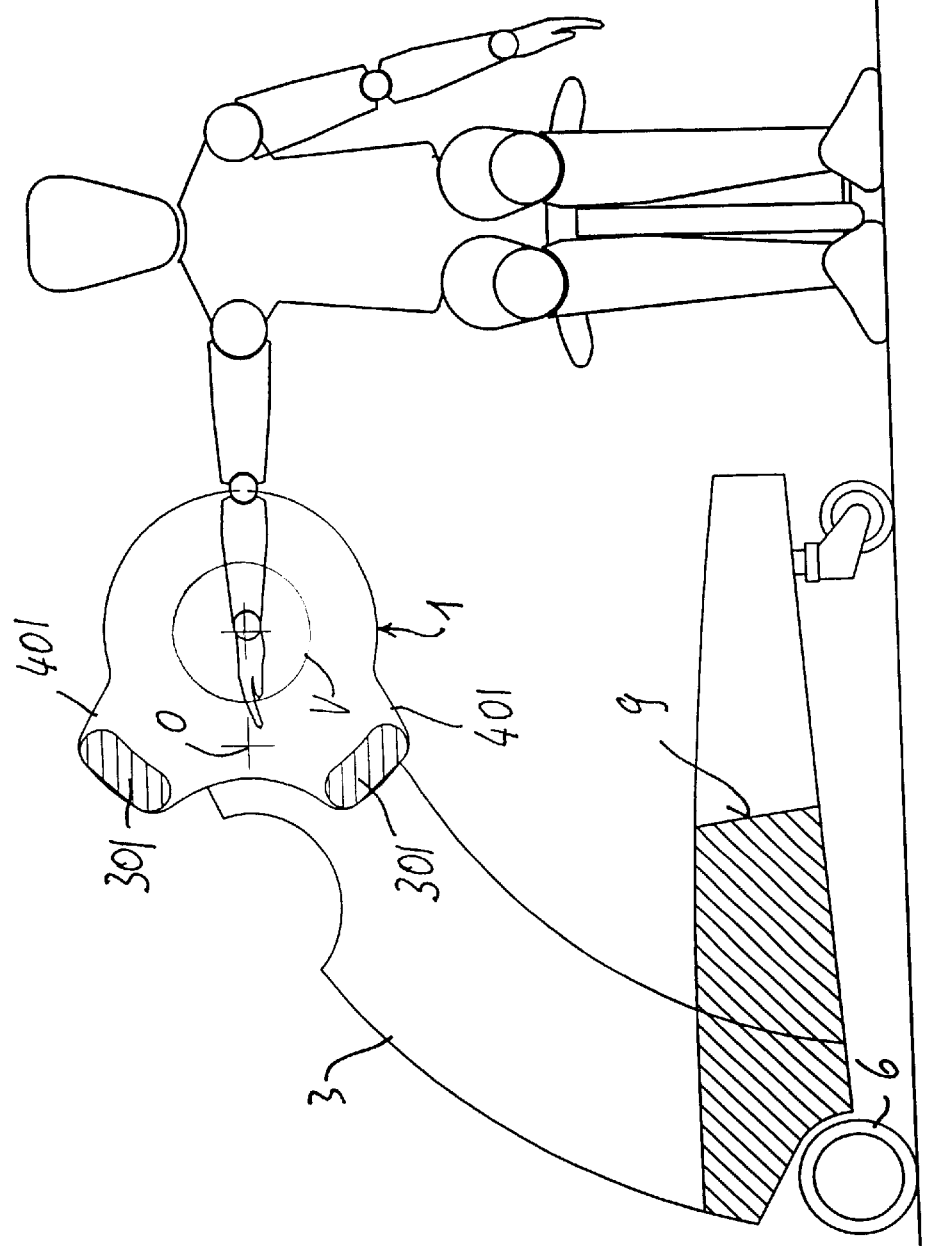

Referring to FIG. 1, a Nuclear Magnetic Resonance imaging apparatus comprises a magnetic structure 1 of the type having an annular magnet. The magnetic structure is mounted between two vertical walls 2, 3 in such a manner as to be able to oscillate and with the axis of the apertures which form a through duct 101 being oriented perpendicular to a horizontal axis of oscillation O, the latter being indicated more clearly in FIG. 8. Particularly, the magnetic field is generated by two opposite poles, which are transverse to the axis of oscillation O. Hence, the static magnetic field is parallel to this axis of oscillation O. The magnetic structure substantially has, without limitation, a rotationally symmetric geometry with respect to the central axis, parallel to the static magnetic field, i.e. perpendicular to the two opposite poles and the axis of oscillation O passes through a peripheral zone of its radial extension. Particularly, the shape of the magnetic structure, as seen from the sides transverse to the static magnetic field and to the axis of oscillation O is substantially elliptical or anyway oblate, so as to have a greater radius and a smaller radius. The axis of oscillation passes through a peripheral zone of the magnetic structure, which passes through the smaller radius. This characteristic enables the pole area to run a certain vertical stroke with the help of the oscillation of the whole structure, while limiting the space requirement of the structure. This stroke run by the imaging area situated between the poles, with the oscillation of the structure is shown in FIG. 8. Naturally, the level differences depend on the absolute dimensions of the parts and on the ratios thereof.

Anyway, the axis of oscillation O is situated higher than the distance from the point whereat it passes through the magnet structure and the diametrically opposite peripheral point of said structure, so as to enable accurate vertical downward positioning of the magnetic structure 1.

The substantially elliptical shape of the branches of the magnetic structure which are perpendicular to the axis of rotation provides a magnetic structure which is comparatively thin or anyway oblate when seen in the direction of the axis of the through aperture 101. This provides a considerable weight reduction, which is a remarkable feature in the apparatus of the invention. In the peripheral areas, the structure is much thinner than in the area of the median horizontal plane.

In combination with the above, advantages may be obtained from providing circular poles 4 and 5. These poles generate the static magnetic field which, in the area therebetween and thereof has sufficient characteristics for Nuclear Magnetic Resonance imaging. This area, which can be approximated by a sphere having a predetermined volume is denoted as V in the figures. The combination of the elliptical shape of the branches of the structure 1 arranged to bear the poles 4 and 5 with the circular shape of the latter is an efficient compromise to obtain at the same time a good surface of the poles 4, 5 and a structure with a minimized weight and a comparatively limited extension, especially in the radial direction of the axis of oscillation.

The walls 2, 3 are part of a cart framework which has wheels 6. These wheels may be simply idle or at least a pair of wheels may be rotatably driven by a motor, e.g. an electric motor. One of the two vertical walls 3 forms a side of a cabinet 7 for containing the electronic equipment for detecting and reconstructing Nuclear Magnetic Resonance images. A control panel 8 is associated to the cabinet 7, and includes the controls and indicators for operating and controlling the functions of the apparatus. The panel 8 may be simply oriented or even possibly separated from the cabinet 7 to allow a more convenient use thereof by the working staff. The apparatus has a reduced size and the working staff should be able to perform the necessary operations comfortably, without interfering with the patient under examination. Advantageously, the control panel 8 is placed on the face of the cabinet 7 at the end of the cart framework, i.e. on one side of the apparatus perpendicular to the one whereto the patient shall approach to insert a limb, such as an arm or a leg into the apparatus.

When the control panel 8 is removable, it has, for instance, a multipole wire for connection to, or means for communication, by IR or else, with the electronic equipment in the cabinet.

The two support walls 2, 3 of the magnetic structure advantageously have each, in the upper area, associated to the magnet, two peripheral apertures forming a grip handle for the patient in his/her different positions with respect to the apparatus. These handles provide advantages in assisting the patient to be as still as possible during imaging.

As is apparent in FIG. 8, and in the preceding FIGS. 2 to 7, the dimensions of the apparatus are accurately related to the type of limbs which are designed to be examined and to the average human anatomy.

Referring to FIGS. 2 to 5, several different operating conditions of the apparatus of the invention are shown. The dimensions of the apparatus are such that, when the patient is sitting, the apparatus has a vertical dimension of ¾ to ⅘ of the overall height and terminates by its upper extensions substantially at the height of the shoulder of the patient. Particularly, the axis of oscillation O is situated slightly below the shoulder, substantially at the height of the sternum of the patient.

The dimensions of the magnetic structure with respect to the greater axis are of the order of about ⅛ to ⅜ of the height of the patient in the sitting position. Thanks to the positioning of the axis of oscillation O and to the dimensions of the magnetic structure and to the distance relationship of the area V between the poles, wherein a static magnetic field is provided having sufficient characteristic to allow valid imaging, from the central axis, the angular movement of the magnetic structure from a position in which the axis of the aperture or through cavity is horizontal, indicated as +90° for the upper position of this area V and as −90° for the lower position of this area V, with respect to the axis of oscillation O, allows to bring the area V in a position which is substantially in line with the leg of the patient as regards the defined lower position and with the arm of the patient as regards the defined upper position.

The shape of the structure, which is elliptical or oval when seen from the surfaces perpendicular to the axis of oscillation O, allows the arm or leg of the patient to be introduced to different depths into the through cavity or aperture, in such a manner that, for instance, the hand and wrist region or the foot and ankle region and the intermediate articulation regions of the elbow and knee can be brought into the area V.

The patient may hold firmly to the structure to be comfortably still in the examination position without having to endure discomforts.

No particular or special seat is required for the patient. The only advantageous requirement is that the seat can be height-adjusted to fit the position of the patient to the anatomic variants with respect to the average anatomy whereto the shape and dimensions of the apparatus are calibrated.

Referring to FIGS. 6 and 7, the magnetic structure is in an angular intermediate position, i.e. with the axis of the through cavity being substantially vertical. Here, the ankle and knee can be examined by simply using platforms allowing to lay the foot of the limb under examination at the different heights required for foot or knee imaging. Particularly, here, Nuclear Magnetic Resonance imaging of these regions of the leg is easily possible in the condition wherein these regions are loaded with the weight of the patient, i.e. in the natural working condition.

As is apparent from FIGS. 6 and 7, the platform may be separate or consisting of suitable shelves, which may be removably and/or height adjustable fixed between the two vertical walls 2 and 3 whereto the magnetic structure is fixed in an oscillating manner.

An examination of limbs under stress conditions is also possible in the operating case as shown in FIGS. 2 to 5. Here, removable and/or possibly position-adjustable members of support walls being substantially vertical or anyway transverse to the axis of the aperture and to the orientation of the limb under examination may be fixed to the magnetic structure or to the vertical walls 2 and 3. In this case, imaging of the above mentioned limb parts may be effected even in higher dynamic stress conditions than the normal stress caused by the weight of the patient.

Naturally, the position of the axis of oscillation O with respect to the vertical plane or to the height level may be also variable. This may be simply obtained by providing that the two walls 2, 3 are movable, or extensible and reducible in the height direction, or that the pivot points of the axis of oscillation O are movable along these walls.

In a further variant, there may be also provided that, by using appropriate cam shoes or plates, the position of the axis of oscillation is variable not only in the vertical direction but also, in a combined manner, along the horizontal component, allowing the magnetic structure to move to a certain extent also laterally with respect to the walls 2, 3 and/or to the lateral dimension of the cart.

FIGS. 9 to 16 show a variant embodiment of the apparatus according to the invention. In the following description, equal parts or parts having equal functions will be denoted by the same reference numbers as used in describing the previous embodiment.

Here, the magnetic structure in use is of the substantially open type and comprises two opposite poles having two support plates which are oriented perpendicular to the axis of oscillation O and are connected together by means of a pair of axial peripheral members 301, situated in one of the two diametrical halves. Preferably, the plates have the same pole geometry, here circular, and the axial connecting members are situated at peripheral radial extensions 401. Hence, the volume enclosed between the two plates is completely open, except the area of the two radial connecting members 301.

Further, in this case, the opening on almost all the sides of the magnetic structure is not turned towards one of the flanks of the cart, but towards the ends of the transverse sides of the longitudinal extension thereof. Particularly, such longitudinal extension is defined as extending in the direction transverse to the axes of the wheels.

In this case, the magnetic structure is supported by two arms or vertical walls 2, 3, branching off from one of the ends of the cart and inclined towards the opposite end, so that, in the mounted condition, the magnetic structure is substantially at the end opposite to that whereat the two support arms or walls 2, 3 are fixed. Moreover, in this area, the cart may have a recess 9 in coincidence with the magnet position, for allowing a better and more comfortable approach by the patient.

The lateral walls or the support arms 2, 3 may be stationary or even inclinable and, like in the previous embodiment, there may be provided that the position of the axis of oscillation can be varied either vertically or in the horizontal plane to a certain predetermined extent for fine adjustment.

Thanks to these arrangements, as shown in FIGS. 10 to 16, several different parts of the patient body can be examined and particularly, thanks to the easy accessibility of the space between the two poles, Nuclear Magnetic Resonance imaging can be also effected of the shoulder region.

The dimensions of the magnetic structure are about ⅛ of the height of the patient in the sitting position, whereas the length of the arms may vary. In fact, the apparati as shown in FIGS. 10 to 12 and 13 to 16 have support arms or walls with different heights. The walls may have a fixed length, the apparatus being provided in two different versions, or may be extended or reduced, e.g. telescopically.

The apparatus according to this embodiment not only has the advantage to allow imaging of the shoulder region but, with the magnetic structure being supported so as to project towards the central area of the cart, also allows Nuclear Magnetic Resonance imaging of patients who cannot be easily moved from their bed or are forced to take complex positions with no capability to move freely.

A further characteristic consists in that the structure of the apparatus is slim and thin and easily allows to use abutment members for imaging limb parts under stress conditions, with the rest or abutment members 10 being kept substantially outside the apparatus.

It has to be noted, as shown in FIG. 17, that particularly this embodiment, but also possibly the previous one allows to examine anatomic regions of the head and of the neck, and for the latter even under stress conditions.

A further characteristic of this embodiment, which can be also easily implemented in combination with the previous one consists in that the cabinet containing the electronic processing equipment and the console is or may be separated from the apparatus, i.e. from the cart which bears the magnetic structure. Advantageously, this cabinet is mounted on a separate cart framework, which can be joined to and disjoined from the cart bearing the magnetic structure. The example of FIG. 9 is merely schematic, and shows no special coupling means, which are trivial for the skilled in the art and may be of any type. However, the cabinet and the cart may be particularly provided with such an exterior shape as to allow at least partial coupling to the exterior shape of a part of the attachment side of the cart bearing the structure. In this specific case, the cabinet which can be separated from the cart has a recess for coupling to at least a part of the end of the support arms of the magnetic ;structure, which are curved. The removable coupling may be obtained by means of bolts, fixed joint or hook-like members and in other manners.

Obviously, the invention is not intended to be limited to what is described and claimed herein, but may be greatly varied, especially as regards construction, without departure from the guiding principle disclosed above and claimed below.

What is claimed is:

1. A Nuclear Magnetic Resonance imaging apparatus of the type for imaging parts of the body, the apparatus comprising:
   a magnetic structure having a cavity for accommodating a part of the body to be examined;
   designed to generate in the cavity, or at least in a part thereof, magnetic and electromagnetic fields required for Nuclear Magnetic Resonance imaging;
   the magnetic structure is mounted on a support in such a manner as to be movable at least in two directions;
   the magnetic structure is supported in such a manner as to be able to oscillate about a horizontal axis of oscillation, parallel to the static magnetic field generated thereby, whereas the axis of oscillation is staggered with respect to a central axis of the cavity and which central axis is parallel to the axis of oscillation and passes through the cavity;
   the static magnetic field has characteristics required for valid diagnostic imaging,
   the cavity being movable between two extreme positions, that is, from an uppermost position to a lowermost position, the two extreme positions and those intervening therebetween being adjusted to the body part in the standing or sitting positions of the patient.

2. An apparatus as claimed in claim 1, wherein the axis of oscillation of the magnetic structure is eccentric to a median axis of the overall geometry thereof, whereas the magnetic structure has radial dimensions, with respect to the median axis thereof, parallel to the axis of oscillation, of 1/10 to 4/10 of the average height of an adult in his/her standing position.

3. An apparatus as claimed in claim 2, wherein the apparatus has a configuration in which the axis of oscillation of the magnetic structure is eccentric to the median axis of the overall geometry thereof, whereas the magnetic structure has radial dimensions, with respect to the median axis thereof, parallel to the axis of oscillation, of ⅛ to ⅘ of the average height of an adult in his/her sitting position.

4. An apparatus as claimed in claim 1, wherein the position of the axis of oscillation of the magnetic structure with respect to the ground is generally higher than the greatest radial dimensions of the magnetic structure with respect to the ground.

5. An apparatus as claimed in claim 1, wherein an aperture for access to the imaging cavity of the magnetic structure is provided in such a position that at least a part thereof has a central axis perpendicular to the axis of oscillation, whereas in the two upper and lower positions, it is at least partly turned towards the patient, and in the perpendicular condition of said axis of the aperture, it is substantially turned downwards or upwards.

6. An apparatus as claimed in claim 1, wherein the magnetic structure has an annular shape, round, oval, non-round, rectangular, square, or polygonal shape or a combination of these shapes, either symmetrical or asymmetrical to one or more reference axes or points, which structure is supported in such a manner as to be able to oscillate with an eccentric axis radial to the axis of two apertures for accessing a through cavity, the axis of the apertures being perpendicular in the intermediate position and the upper and lower positions being rotationally symmetrical.

7. An apparatus as claimed in claim 1, wherein the magnetic structure has two opposite poles preferably circular and connected together by at least an axial member perpendicular to the poles and joint thereto at least at one peripheral point thereof.

8. An apparatus as claimed in claim 7, wherein the axial member has the shape of at least one column.

9. An apparatus as claimed in claim 8, characterized in that the two columns are grouped in the peripheral area of the two opposite poles in order to provide a wider access aperture.

10. An apparatus as claimed in claim 1, wherein the imaging cavity area in which the magnetic field of the structure to provide valid Nuclear Magnetic Resonance imaging, is located in the median region of the overall radial dimensions of the magnetic structure with reference to the median axis thereof, parallel to the axis of oscillation.

11. An apparatus as claimed in claim 1, wherein the magnetic structure has sides transverse to the open sides, the latter being transverse to the axis of oscillation, which have a circular or oval or substantially elliptical plan shape, the axis of oscillation being eccentric to the greater axis of the elliptical shape.

12. An apparatus as claimed in claim 1, wherein the height position of the axis of oscillation of the magnetic structure from the ground is variable.

13. An apparatus as claimed in claim 1, wherein the apparatus has a structure for supporting the magnetic structure comprising two opposite uprights whereto the respective sides of the magnetic structure are pivoted about the axis of oscillation, while it is possible to provide, alternatively or in combination, that the pivot points of the magnetic structure are supported in such a manner as to be able to move with respect to the uprights, or that the uprights are extensible and reducible or inclinable.

14. An apparatus as claimed in claim 1, wherein the pivot points of the magnetic structure that is, the axis of oscillation thereof, are movable at least along one further horizontal component.

15. An apparatus as claimed in claim 13, wherein the magnetic structure and the uprights are supported upon a wheeled freely movable cart.

16. An apparatus as claimed in claim 15, wherein the cart is of the idle type or provided with motor-driven, particularly electric, propulsion means.

17. An apparatus as claimed in claim 16, wherein the apertures for access to the imaging cavity or the axis of oscillation is parallel or transverse or perpendicular to the longitudinal axis of the cart, that is to the axis of the wheels.

18. An apparatus as claimed in claim 17, wherein the support uprights branch off from an end of the cart and are inclined or curved towards the opposite end, bearing the magnetic structure which projects over the area extending from the central zone to said opposite end of the cart.

19. An apparatus as claimed in claim 15, wherein the cart has one or more recesses on the sides associated to the aperture/s of the magnetic structure.

20. An apparatus as claimed in claim 1, wherein the static magnetic field generated by the magnetic structure is parallel to the axis of oscillation.

21. An apparatus as claimed in claim 1, wherein the uprights have ergonomic grip handles integrated therein or attached thereto.

22. An apparatus as claimed in claim 15, wherein abutment members or walls are fixed to the uprights or to the cart, for examining anatomic regions of limbs under stress conditions.

23. An apparatus as claimed in claim 1, wherein the dimensions of the magnetic structure in the direction of depth of the imaging cavity between the poles in order are to examine all the head, and/or the neck, and/or the length of an upper and/or lower limb up to the area connected to the trunk.

24. An apparatus as claimed in claim 1, wherein it has a console or control panel, which is at least oriented, but even moved away or separated from the structure or disjoined from the apparatus, being provided, in this case, with a connecting wire.

25. An apparatus as claimed in claim 15, wherein a cabinet containing the processing or displaying electric and electronic units is also accommodated on the cart.

26. An apparatus as claimed in claim 1, wherein the cabinet containing at least a part of the electric and electronic units is mounted on a separate cart, which can be joined to and disjoined from the cart bearing the magnetic structure with or without the console.

27. An apparatus as claimed in claim 7, wherein the axial member has the shape of at least two columns along the circumference of the poles.

* * * * *